United States Patent [19]
Kim

[11] Patent Number: 5,974,364
[45] Date of Patent: Oct. 26, 1999

[54] METHOD FOR CONTROLLING A TEST MODE OF AN ELECTRIC DEVICE

[75] Inventor: In-soo Kim, Seoul, Rep. of Korea

[73] Assignee: Samsung ELectronics Co., Ltd., Rep. of Korea

[21] Appl. No.: 09/013,999

[22] Filed: Jan. 27, 1998

[30] Foreign Application Priority Data

Jan. 29, 1997 [KR] Rep. of Korea ......................... 97-2532

[51] Int. Cl.⁶ .................................................. G06F 11/00
[52] U.S. Cl. .............................. 702/125; 702/79; 702/89; 702/176; 364/528.41
[58] Field of Search .................................. 702/125, 108, 702/130, 132, 79, 89, 176; 364/166, 159, 177, 179, 703, 528.41; 395/556

[56] References Cited

U.S. PATENT DOCUMENTS

| | | | |
|---|---|---|---|
| 4,471,452 | 9/1984 | Borchert | 702/125 |
| 5,341,288 | 8/1994 | Shinskey | 702/108 |
| 5,361,230 | 11/1994 | Ikeda et al. | 365/194 |
| 5,453,993 | 9/1995 | Kitaguchi et al. | 371/22.5 |
| 5,490,059 | 2/1996 | Mahalingaiah et al. | 702/125 |
| 5,629,684 | 5/1997 | Isshiki et al. | 340/825.06 |
| 5,717,652 | 2/1998 | Ooishi | 365/233 |

Primary Examiner—John Barlow
Assistant Examiner—Hien Vo
Attorney, Agent, or Firm—Dilworth & Barrese

[57] ABSTRACT

A method for performing a test and controlling the test mode of an electric device. The method reduces the amount of time and labor expended during fabrication, and accordingly enhances productivity by detecting time information from a timer (a clock generator, or a variable clock generator) and multiplying the detected time information by a predetermined value, and controlling the driving time of the device during a test operation in response to the multiplied time value.

9 Claims, 3 Drawing Sheets

METHOD FOR CONTROLLING A TEST MODE OF AN ELECTRIC DEVICE

BACKGROUND OF THE INVENTION

1. Field of the Invention

The present invention relates to testing electric devices, and more particularly to a method for controlling the test mode of an electric device by scaling and reducing the necessary time for the derived test.

2. Description of the Related Art

Typically, in fabricating electric devices including a microcomputer, the electric devices are necessarily tested in a test mode for ensuring their quality. At this time, the test mode may be applied to every fabricated electric device, or some electric devices sampled from the fabricated devices.

For example, when a sleep mode of a television is tested, the TV should standby for a minimum time to set the sleep mode. Assuming that the sleep mode can be set in the TV at every ten minutes, the TV should standby for at least ten minutes in order to make a determination as to whether the sleep mode is operating normally or not.

For testing a volume adjusting unit (also known as a volume), the volume of the volume adjusting unit is increased from a minimum level to a maximum level and decreased from the maximum level to the minimum level again. At this time, approximately 360 ms is taken to move between respective units (or steps) of the volume. If the amount of time required for moving from the minimum level to the maximum level is divided into 100 steps, it would take a total of 72 minutes for the volume to increase from the minimum level to the maximum level and decrease from the maximum level to the minimum level again.

Consequently, the fabrication/manufacturing process cannot be followed during the test time. This causes loss of labor and time, and can result in reduced productivity.

SUMMARY OF THE INVENTION

It is therefore an object of the present invention to provide a method for controlling the test mode of an electric device, which is capable of reducing the standby time for a test by making the microcomputer of the device recognize a time value, detected by a timer, as an increased time value that is obtained by multiplying the detected time value by a predetermined value. In other words, the detected time value is scaled according to the selected test mode.

These and other objects are achieved according to the present invention by providing a method for performing a test mode of an electric device having a microcomputer that detects time information from a timer, the method comprising the steps of: calculating a time value by multiplying the detected time information by a predetermined value when a test mode is selected; and determining a driving time for driving the electric device according to the calculated time value.

Preferably, the method for performing a test mode of an electric device further comprises the step of stopping the test mode and returning to a normal mode if the calculated time value is the same as an adjustable predetermined time value.

According to another feature of the present invention, a method for performing a test mode of an electric device having a microcomputer that detects time information using clocks generated from a variable clock generator, comprises the steps of: controlling the variable clock generator to generate clocks at a velocity increased by a predetermined value when a test mode is selected; and controlling a driving time of the electric device by counting the clocks generated at the increased clock generating velocity. The predetermined value is adjustable.

DETAILED DESCRIPTION OF PREFERRED EMBODIMENTS

A preferred embodiment of a method for performing a test mode of an electric device according to the present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

A first essential point of the present invention is that the microcomputer of the electric device being tested recognizes clocks generated in a timer (or a clock generator) at a predetermined velocity as a real time in a normal mode, and as a scaled time value increased by multiplying the real time by a predetermined value in a test mode.

In other words, in an electric device including a clock generator that generates sixty clocks per minute, one clock is counted as one second in a normal mode and counted as a predetermined time value, for example, one minute or ten minutes, in the test mode. If one clock is set to be recognized as one minute in the test mode, a test process that requires ten minutes in real time can be performed in 10 seconds, actually. If it is determined that one clock is recognized as ten seconds, a test process that requires ten minutes can be performed in one minute.

A second essential point of the present invention is that the microcomputer of the device being tested controls a variable clock generator to generate clocks at a normal velocity in a normal mode and at an increased velocity in a test mode.

Figure 1:
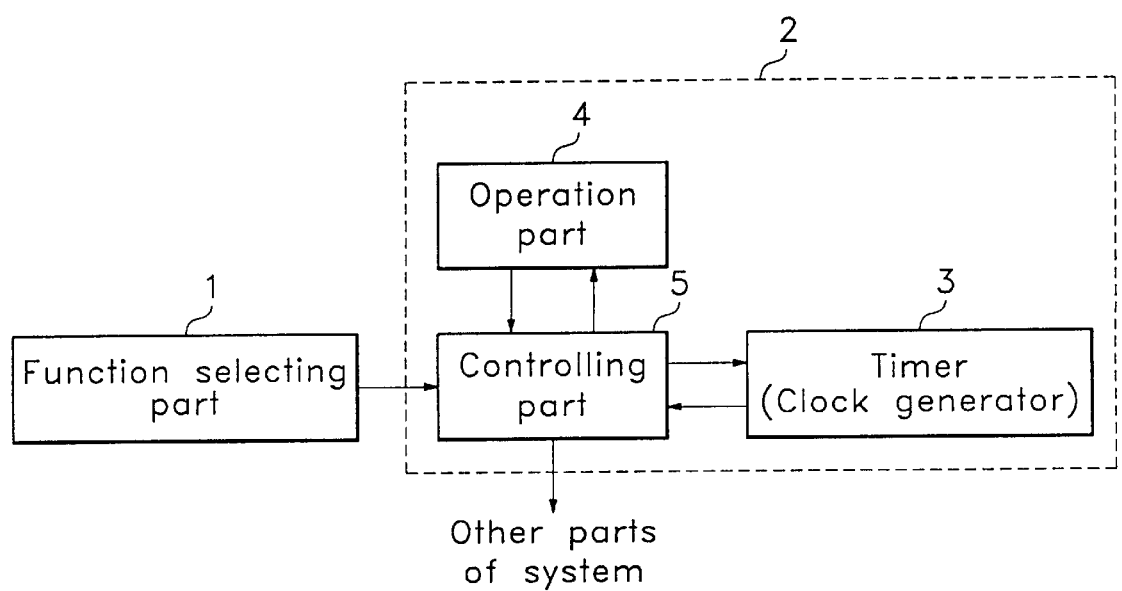
FIG. 1 is a schematic block diagram of an embodiment of an electric device for performing a test mode according to the present invention.

FIG. 1 is a schematic block diagram of an electric device for performing a test mode according to the present invention. As shown, the electric device to be tested includes a function selecting part 1 including a plurality of function keys (not shown) that allow an operator to select a test mode and various other functions, and a microcomputer 2 that controls other parts of the system of the electric device according to a function selected through the function selecting part 1.

The microcomputer 2 includes a timer 3 for outputting time information, an operation part 4 for calculating a time value by multiplying the time information outputted from the timer 3 by a time value that is appropriate for the selected function, and a controlling part 5 for controlling other parts of the system of the electric device according to results of the calculation in operation part 4.

Figure 2:
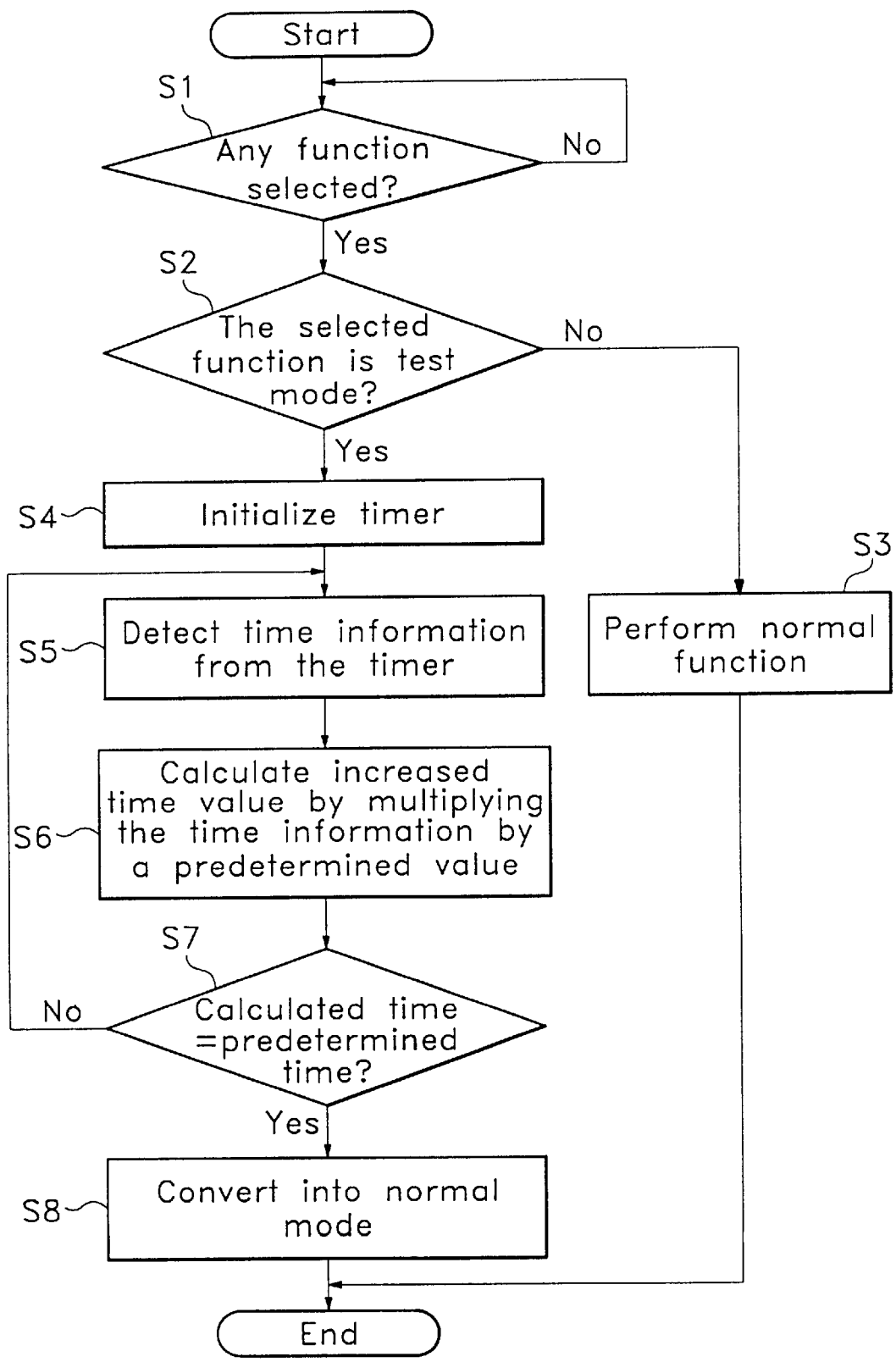
FIG. 2 is a flowchart of the operation of the microcomputer shown in FIG. 1.

The operation of the microcomputer 2 according to the present invention will be described hereinafter with reference to FIG. 2. First, at step S1, the controlling part 5 of microcomputer 2 determines whether any function is selected through the plurality of function keys arranged on function selecting part 1. Then, at step S2, the controlling part 5 determines whether the selected function is a test mode or not. If it is determined that the selected function is not a test mode at step S2, controlling part 5 controls other parts of the system of the electric device to perform their respective functions according to control signals corresponding to the selected function key (step S3). At this time, the controlling part 5 controls the other parts of the system using real time information supplied from the timer 3.

On the other hand, if a test mode function key is selected, a signal corresponding to the selected test mode is transmitted to the controlling part 5. Accordingly, controlling part recognizes the test mode selected at step S2. Once a test mode has been determined, timer 3 is reset and initialized at step S4 followed by step S5 at which counted time information is detected.

Thereafter, the detected time information is transmitted to operation part 4. The operation part 4 is controlled to calculate an increased time value by multiplying the detected time information by a predetermined value at step S6. At this time, reference values for testing the electric device are designated in operation part 4. In other words, a predetermined value for use in multiplying the time information and an exit time value for terminating the test mode are designated in operation part 4. Accordingly, operation part 4 calculates a time value by multiplying the time information transmitted from the controlling part 5 by the predetermined value. At step S7, the calculated result is compared with the predetermined exit time value. If it is determined that the calculated result is different from the predetermined exit time value at the comparing step S7, this means that the time for the test has not lapsed. Controlling part 5 then controls the process to return to step S5 so that the following steps starting from step S5 are carried out again.

If it is determined that the calculated result is the same as the predetermined time value, this means that the time for the test has lapsed. Accordingly, controlling part 5 terminates the test mode and converts the process into a normal mode at step S8. This is the end of the operation.

The above described operation of the present invention will be described in detail with reference to an example. If a test mode is selected to test the sleep mode of a TV, controlling part 5 then recognizes that the test mode is selected (step S2). Controlling part 5 then detects time information counted by the timer 3 (step S5). If it is assumed that the sleep time is set at ten minutes, and a predetermined value is 10, operation part 4 recognizes the counted time information of one second as ten minutes time value. Accordingly, a sleep time of 10 minutes can be completed in one minute. Therefore, the time required for the test can be reduced.

Figure 3:
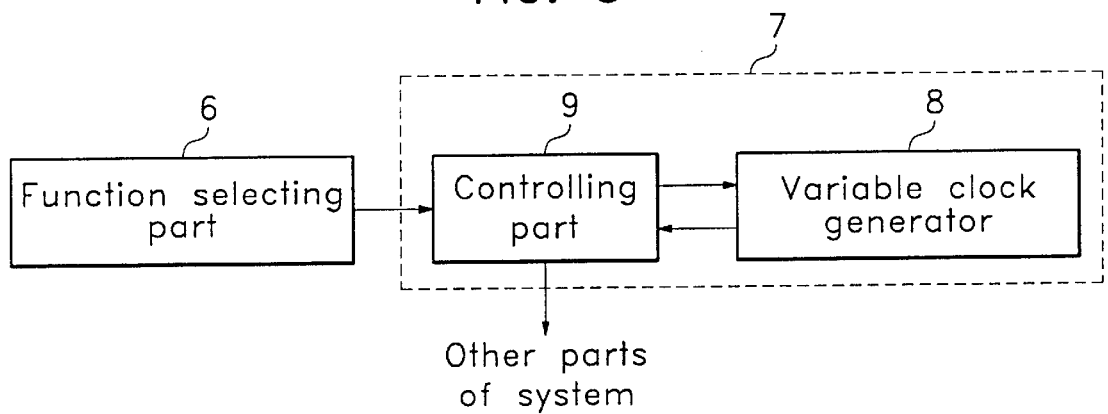
FIG. 3 is a schematic block diagram of another embodiment of an electric device for performing a test mode according to the present invention.

FIG. 3 is a schematic block diagram of another embodiment of an electric device for controlling a test mode according to the present invention. As shown, the electric device includes a function selecting part 6 including a plurality of function keys (not shown) that allow an operator to select a test mode and various other functions, and a microcomputer 7 that controls other parts of the system of the electric device according to the function selected through the function selecting part 6.

Microcomputer 7 includes a variable clock generator 8 for generating clocks at a variable velocity, and a controlling part 9 for controlling the other parts of the system by an increased clock generating velocity that is appropriate for the selected function.

Figure 4:
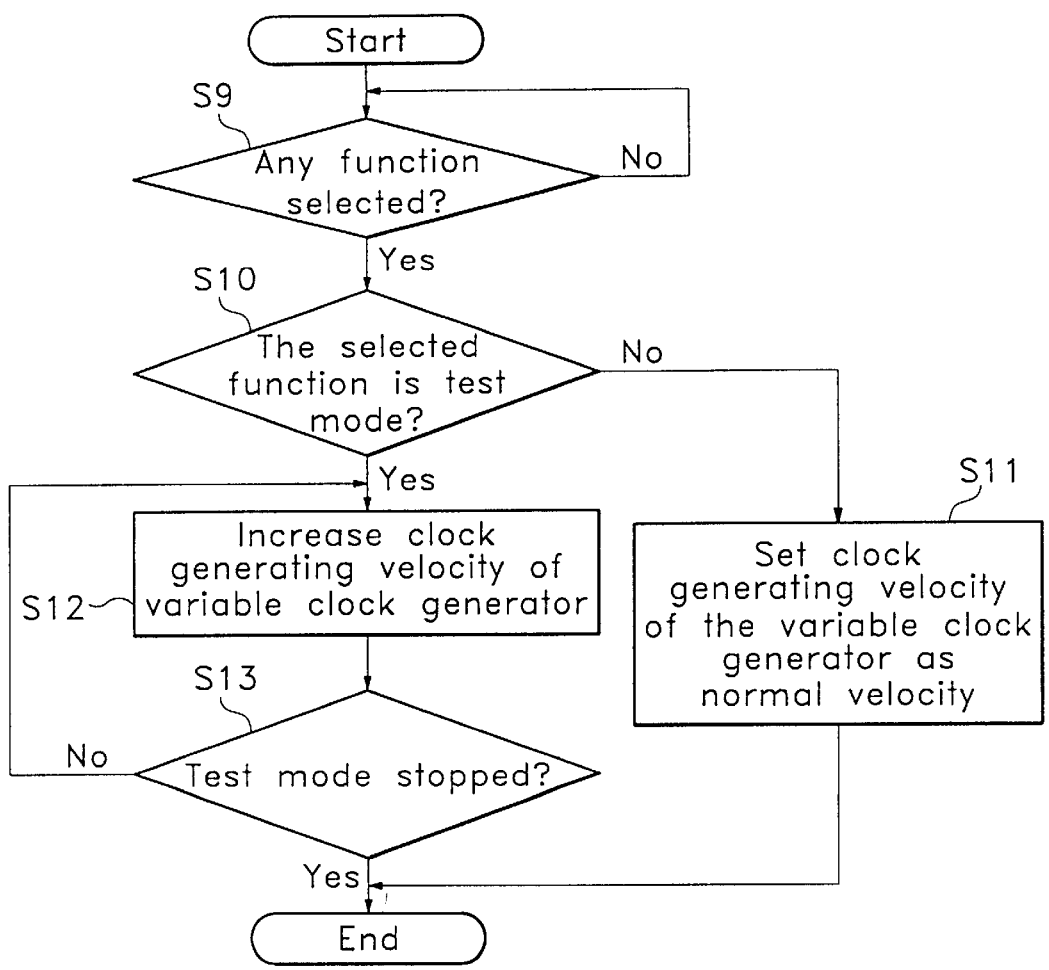
FIG. 4 is a flowchart of the operation of the microcomputer shown in FIG. 3.

The operation of this embodiment of the electric device according to the present invention will be described in detail with reference to FIG. 4. First, at step S9, controlling unit 9 of microcomputer 7 determines whether any function is selected through the plurality of function keys arranged on the function selecting part 6. At step S10, it is determined whether or not the selected function is a test mode. If it is determined that the selected function is not a test mode, the clock generating velocity of the variable clock generator is designated as a normal velocity at step S11.

At this time, controlling part 9 is supplied with clock information generated in the variable clock generator 8 at the normal velocity. The controlling part 9 recognizes the supplied clock information as real time information and thereby controls respective parts in the system.

On the other hand, if a test mode function key is selected, a signal corresponding to the test mode function key is transmitted to controlling part 9. According to the signal, controlling part 9 recognizes that a test mode is selected at step S10. Controlling part 9 then controls the variable clock generator 8 to increase the clock generating velocity thereof by multiplying the clock generating velocity by a predetermined value (step S12). Controlling part 9 controls the driving time of the respective parts of the system according to an increased time value associated with the clocks generated at the increased velocity.

Thereafter, controlling part 9 checks whether the test mode is stopped or not at step S13. If it is determined that the test mode has not stopped, the process is returned to step S12 to go through the following steps again. Otherwise, if it is determined that the test mode is stopped, the process is terminated.

The predetermined value can be adjusted. The method for adjusting the predetermined value is easily understood by those skilled in this art. Therefore, description thereof will be omitted.

Consequently, in a method for performing and controlling a test mode of an electric device according to the present invention, a microcomputer in the electric device recognizes time information detected by a timer (or a clock generator) as real time in a normal mode, and as an increased time value obtained by multiplying the time information by a predetermined value in a test mode thereby, reducing the time required for the test mode.

In addition, as a result of the reduced time for carrying out the test mode, loss of labor and time can be minimized which enhances productivity.

What I claim is:

1. A method for controlling a test mode of an electric device having a microcomputer that detects time information from a timer, comprising the steps of:

calculating a time value by multiplying said time information by a predetermined value when the test mode is selected; and controlling a driving time of said electric device according to said calculated time value to perform an operation of said electric device within said calculated time value.

2. The method for controlling a test mode of an electric device according to claim 1, further comprising a step of stopping the test mode and converting into a normal mode when said calculated time value is the same as a predetermined time value.

3. The method for controlling a test mode of an electric device according to claim 1, wherein said predetermined values can be adjusted.

4. A method for controlling a test mode of an electric device having a microcomputer that detects time information using clocks generated by an internal, self-contained variable clock generator, the method comprising the steps of:

controlling the internal, self-contained variable clock generator to generate clock signals at an increased velocity when the test mode is selected; and controlling a driving time of said electric device by counting said generated clock signals at said increased velocity.

5. The method according to claim 4, wherein said step of controlling further comprises the step of multiplying a clock generating velocity by a predetermined value to generate the clock signals at the increased velocity.

6. The method according to claim 5, wherein said predetermined value is adjustable.

7. A method for testing an electric device having a microcomputer for detecting time information from a timer, the method comprising the steps of:

detecting activation of a test mode;

manipulating a modified ratio of the detected time information to create a modified time value representative of the detected time information if activation of the test mode has been detected; and controlling a driving time of the electric device according to the modified time value to perform an operation of said electric device within said modified time value.

8. The method according to claim 7, wherein said step of manipulating further comprises the step of calculating the modified time value by multiplying the detected time by a predetermined value.

9. The method according to claim 8, wherein the predetermined value is adjustable based on a selected test mode.

* * * * *